US006270946B1

(12) United States Patent
Miller

(10) Patent No.: US 6,270,946 B1
(45) Date of Patent: Aug. 7, 2001

(54) NON-LITHOGRAPHIC PROCESS FOR PRODUCING NANOSCALE FEATURES ON A SUBSTRATE

(75) Inventor: Michael B. Miller, Christiansburg, VA (US)

(73) Assignee: Luna Innovations, Inc., Blacksburg, VA (US)

( * ) Notice: Subject to any disclaimer, the term of this patent is extended or adjusted under 35 U.S.C. 154(b) by 0 days.

(21) Appl. No.: 09/502,130

(22) Filed: Feb. 10, 2000

Related U.S. Application Data
(60) Provisional application No. 60/125,003, filed on Mar. 18, 1999.

(51) Int. Cl.[7] .................................................. G03C 5/00
(52) U.S. Cl. ........................ 430/296; 430/311; 430/330; 430/942; 430/967
(58) Field of Search ................................... 430/296, 311, 430/330, 942, 967

(56) References Cited

U.S. PATENT DOCUMENTS

| | | | |
|---|---|---|---|
| 5,077,085 | 12/1991 | Schnur et al. | 427/98 |
| 5,208,111 | 5/1993 | Decher et al. | 428/420 |
| 5,518,767 | 5/1996 | Rubner et al. | 427/259 |
| 5,536,573 | 7/1996 | Rubner et al. | 428/378 |
| 5,716,709 | 2/1998 | Ferguson et al. | 428/420 |

OTHER PUBLICATIONS

Bernhard H. Weigl, Jennah Kriebel, Kelly Mayes, Paul Yager, Cai Cai Wu, Mark Holl, Margaret Kenny, Diane Zebert, Simultaneous self–referencing analyte determination in complex samle solutions using microfabricated flow structures (T–Sensors™), Internet–www.micronics.net/banffhtml/banff paper.htm, publication date unknown.

Phillip F. Schewe and Ben Stein, "Nanotubes," *The American Institute of Physics Bulletin of Physics News*, Mar. 21, 1997, No. 312.

Foresight Institute, "Preparing for Nanotechnology," Internet—www.foresight.org/hotnews/index.html, publication date unknown.

ZRL Research News, "Light stamps' could simplify optical lithography," Internet—www.zurich.ibm.com/News/Stamps/ ,publication date unknown.

Hongjie Dai, Jason H. Hafner, Andrew G. Rinzler, Daniel T. Colbert, Richard E. Smalley, "Nanotubes as Nanoprobes in Scanning Probe Microscopy," *Nature*, 1996, pp. 147–151, Internet—//cnst.rice.edu/TIPS rev.htm.

Jason Hafner, "Nanotube Tips for SFM," Internet—//cnst.rice.edu/mount.html, publication date unknown.

Katerina Moloni, M. Buss, J. Liu, R.P. Andres, "AFM Imaging of Nanometer Scale Objects in Water", Internet—www.aps.org/BAPSMAR98/ABS/S3760.html,Mar. 1998, S19.01.

Elizabeth A. Dobisz, F. Keith Perkins, Susan L. Brandow, Jeffrey M. Calvert, Christie R.K. Marrian, "Self–Assembled Monolayer Films for Nanofabrication," *Materials Research Society Symposium Proceedings*, Apr. 19–20, 1995, vol.. 380, San Francisco, Ca, U.S.A.

Author unknown, Washington, Jan. 28. (Article on dip–pen nanolithography).

Author unknown, "New Pen Draws Very Tiny Lines," Jan. 28, 1999, Internet—www.lasvegassun.com/stories/.

Christie R. Marrian, Editor, "Technology of Proximal Probe Lithography," *SPIE Proceedings*, vol. IS10, 1993.

Phillip F. Schewe and Ben Stein, "Nano–CDs with 400 GVIT/IN$^2$ Data Storage Density," *Physics News Update*, Feb. 25, 1998, No. 360.

Jeffrey Soreff, "Recent Progress: Steps Toward Nanotechnology, " *Foresight Update 22*, p. 3, Internet—www.foresight.org/Updates/Update22/Update22.3.html, Oct. 15, 1995.

Arun Majumdar and Stuart M. Lindsay, "Role of Scanning Probe Microscopes in the Development of Nanoelectronic Devices," *Technology of Proximal Probe Lithography*, pp. 33–55, publication date unknown.

M.A. McCord and R.F.W. Pease, "Principles and Techniques of STM Lithography," *Technology of Proximal Probe Lithography*, pp. 16–32, publication date unknown.

Roland Wiesendanger, "Nanofabrication by Scanning Probe Instruments: Methods, Potential Applications and Key Issues," *Technology of Proximal Probe Lithography*, pp. 162–187, publication date unknown.

T.A. Jung, A. Moser, M.T. Gale, H.J. Hug, U.D. Schwartz, "Atomic force microscopy experimentation at surfaces: Hardness, wear and lithographic applications," *Technology of Proximal Probe Lithography*, pp. 234–267, publication date unknown.

*Primary Examiner*—Christopher G. Young
(74) *Attorney, Agent, or Firm*—Joy L. Bryant

(57) ABSTRACT

A non-lithographic process for producing nanoscale features on a substrate is presented. The process involves applying to and reacting a first difunctional molecule with the surface of a substrate. A second difunctional molecule is applied and reacted with unreacted functional groups from the first difunctional molecule to form a patterned layer on the surface of a substrate. Selective application of the difunctional molecules is accomplished by using a nanoscale delivery device.

42 Claims, 5 Drawing Sheets

Step 1

Step 2

Step 3

Step 4

Step 5

NON-LITHOGRAPHIC PROCESS FOR PRODUCING NANOSCALE FEATURES ON A SUBSTRATE

CROSS-REFERENCE TO RELATED APPLICATIONS

This application claims the benefit of U.S. Provisional Application No. 60/125,003, entitled, "Non-Lithographic Process for Producing Nanoscale Features on a Substrate," filed Mar. 18, 1999, hereby incorporated by reference in its entirety.

FIELD OF THE INVENTION

The present invention relates to a non-lithographic process for producing nanoscale features on a substrate.

BACKGROUND OF THE INVENTION

Optical lithography using projection or direct printing of a mask pattern has been the standard technology for fabricating patterned electronic devices. The size of the components produced depends on the ability of the optics to produce very small images in photo resist or mask materials. This is ultimately limited by the wavelength of the radiation used for exposure. In addition, this method only produces a pattern and not a device.

Various optical or electron beam writing approaches have been developed where a small, focused electron or electromagnetic beam is scanned over the surface of a photo resist, affecting a chemical change in the resist material so that it can be removed by subsequent chemical processes. Alternatively, the resist material may remain in place after subsequent chemical processing. The problem with this method is that there are feature size limitations and cost problems.

In yet another method, a small stylus such as an atomic force microscope (AFM) probe has been used to transfer a small amount of chemical to the surface to be patterned, leaving a very small (tens of nanometers) feature on the surface. This method is limited to the chemicals used and the mechanics of the probes themselves.

An object of the present invention is to provide a method to directly fabricate nanoscale electronic devices without using a mask.

Another object of the present invention is to provide a method that creates smaller mask features without using a mask.

Another object of the present invention is to produce a chemical pattern on a substrate for further build-up of multilayered films.

SUMMARY OF THE INVENTION

The foregoing and additional objects were achieved by the method of the present invention. The method allows for the formation of nanoscale features on a substrate that will result in a chemical environment suitable for the buildup of multilayered films. These layers are built-up using self-assembled monolayers or other non-self-assembled chemical systems. The novel feature of the invention lies in the non-lithographic process for creating the nanoscale features on the substrate. As a result of the process, ultra small features for sensors and electronic devices such as transistors and light emitting diodes for computing, display and communications applications can be created.

When executing the process of the present invention, a substrate having a surface is provided. A first difunctional molecule is also provided. This molecule has a functional group capable of reacting with the surface of the substrate. The first difunctional molecule is applied to the surface of the substrate where the functional group reacts with the substrate. Next, a second difunctional molecule is provided. The second difunctional molecule has a functional group capable of reacting with an unreacted functional group of the first difunctional molecule. The second difunctional molecule may be either: selectively applied on top of the first difunctional molecule using a nanoscale delivery device where it is allowed to react; applied on top of the first difunctional molecule, selectively reacted, and washed to remove any unreacted molecules; or applied on top of the first difunctional molecule and left to react followed by washing the substrate to remove any unreacted molecules. Regardless of the technique, the first difunctional molecule and the second difunctional molecule react to form a patterned layer on the surface of the substrate.

Additional objects and advantages of the invention will be set forth in part in the description which follows, and in part will be obvious from the description, or may be learned by practice of the invention. The objects and advantages of the invention will be obtained by means of instrumentalities in combinations particularly pointed out in the appended claims.

BRIEF DESCRIPTION OF THE DRAWINGS

The accompanying drawings illustrate a complete embodiment of the invention according to the best modes so far devised for the practical application of the principles thereof, and in which.

DETAILED DESCRIPTION OF THE PREFERRED EMBODIMENTS

Figure 1:
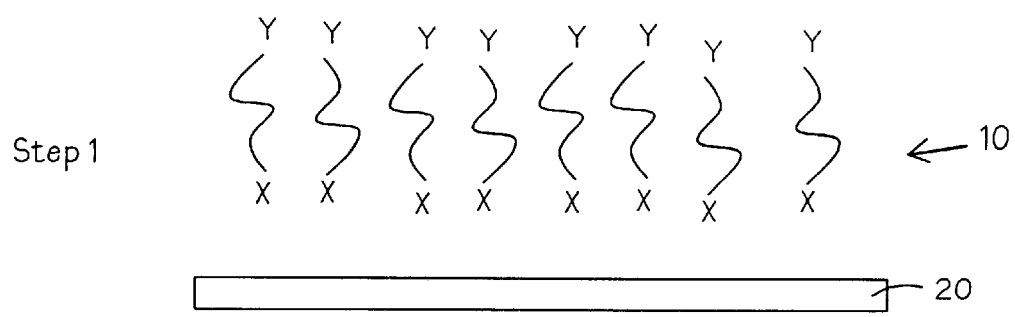
FIG. 1 is schematic representation of the process of the present invention.
Figure 1:
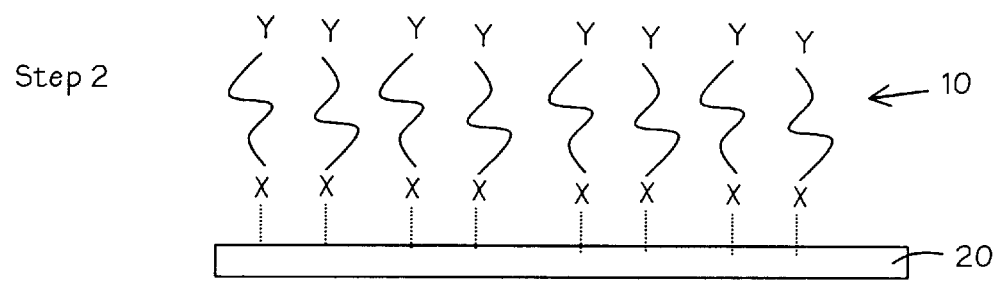
Figure 1:
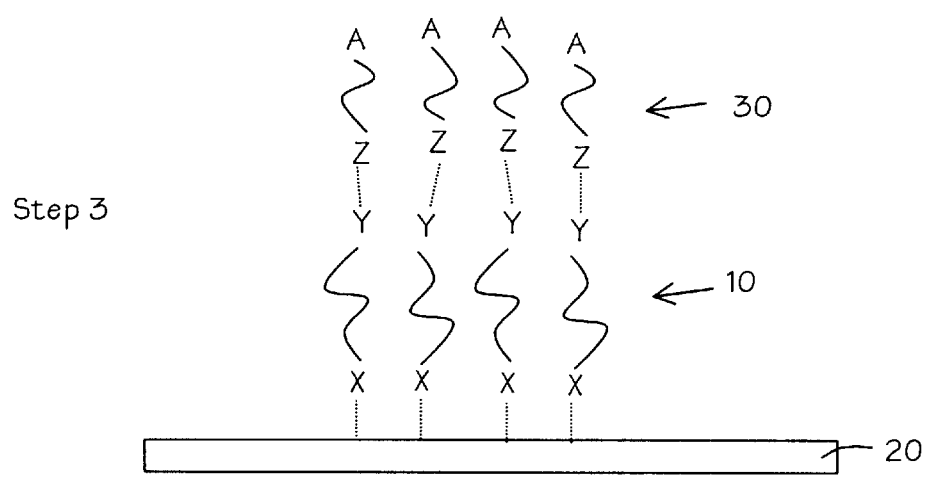
Figure 1:
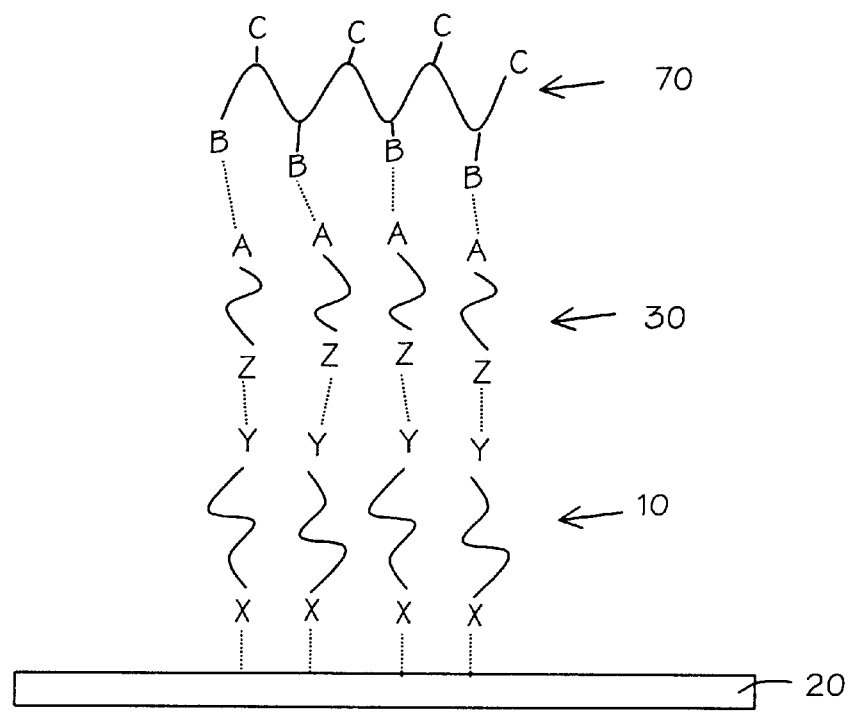
Figure 1:
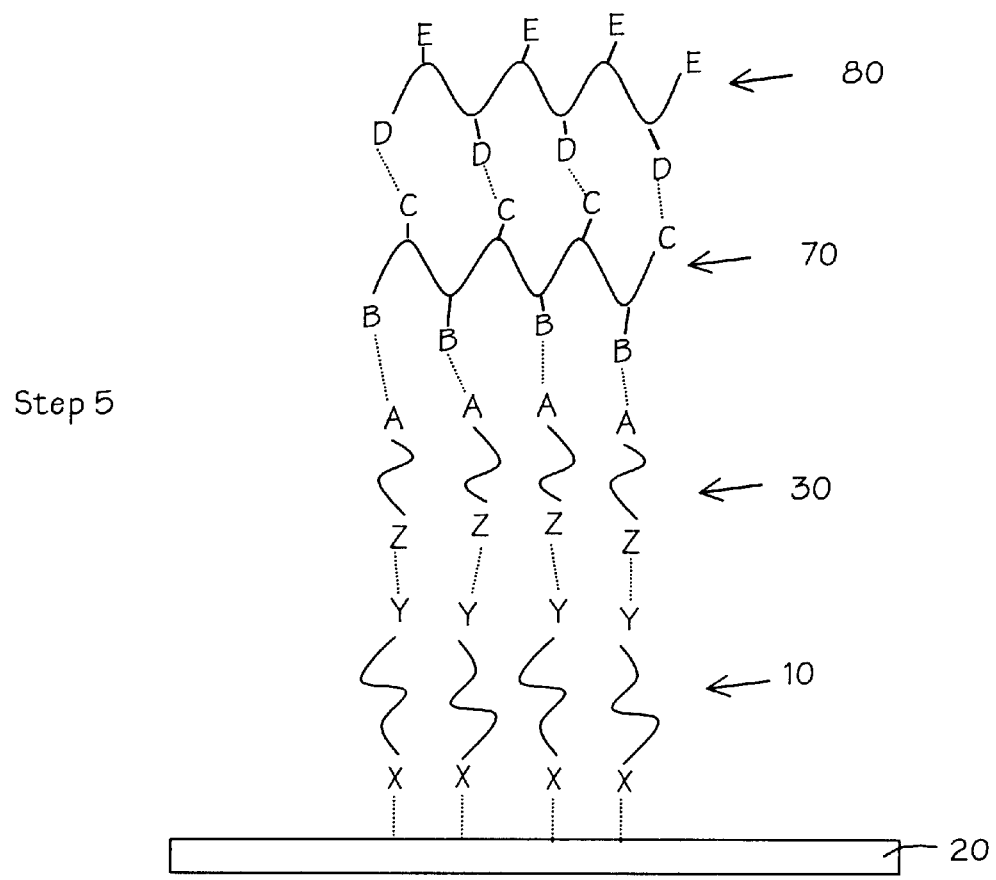
Figure 1:
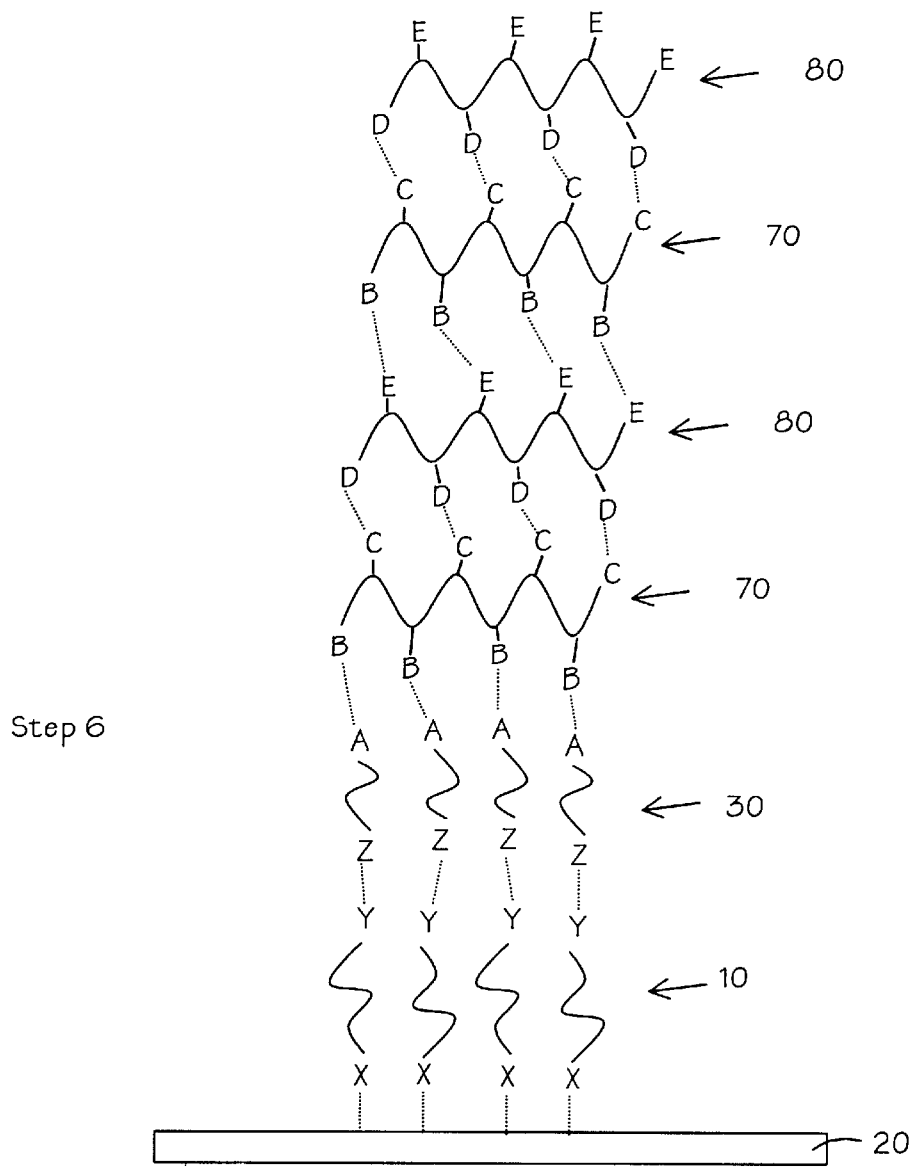

Referring now to the drawings where similar parts are numbered the same, FIG. 1 is a schematic representation of the process of the present invention. In step one, a first difunctional molecule 10 having a functional group (X) capable of reacting with a substrate 20 is provided. The difunctional molecule may be any difunctional molecule known to those skilled in the art, such as a difunctional monomer, oligomer, or polymer. The number of repeat units in the backbone of the molecule may range from 1 to thousands depending on the final application and use. The key to the structure of the first difunctional molecule is that it must have a functional group (X) that can react with the substrate and a second functional group (Y) that can react with a second molecule. Preferably, the functionality of the second group is ionic in structure, however, the second functional group may form a covalent bond as well. The functional groups may be situated only at the ends of the molecule (as in a monomer) or may be located along the backbone and at the end groups of an oligomeric or polymeric molecule.

Any substrate known to those skilled in the art may be used for the present invention and, in particular, substrates prepared from materials such as silicon, glass, metal, polymeric, and germanium may be used. For example, if the substrate is silicon, the functional group (X) capable of reacting with the substrate may be a silane or siloxane group. In another example, if the substrate is gold, the functional group (X) capable of reacting with the substrate may be a thiol group. Using this molecule as an example, the other unreacted functional group (Y) may be an acid. The acid would provide a reactive site for a second difunctional molecule.

The first difunctional molecule is applied to the surface of the substrate and the functional group is allowed to react with the surface of the substrate. The first difunctional molecule is applied to the substrate using any method known to those skilled in the art. In particular, the first difunctional molecule is applied by dipping the substrate in a solution containing the first difunctional molecule. This method allows the entire surface of the substrate to be covered with the first difunctional molecule. Step 2 of FIG. 1 shows the first difunctional molecule 10 after it has reacted with the substrate 20. As shown, the first difunctional molecule reacts with the substrate along those parts of the molecule where the reactive functional groups (X) are distributed. Because of the structure of the molecule, the unreacted functional groups(Y) remain opposite from the reacted functional groups(X).

The next step in the process involves providing a second difunctional molecule 30. The second difunctional molecule 30 has a functional group (Z) that is capable of reacting with the unreacted functional group (Y) of the first difunctional molecule. Once the second difunctional molecule has reacted with the first difunctional molecule, either an ionic or covalent bond is formed. Preferably, this functional group (Z) is capable of forming an ionic bond with the unreacted functional group (Y) of the first difunctional molecule. The second difunctional molecule may be applied on top of the first difunctional molecule using various techniques. In one approach, the second difunctional molecule is selectively applied on top of the first difunctional molecule using a nanoscale delivery device.

Figure 2:
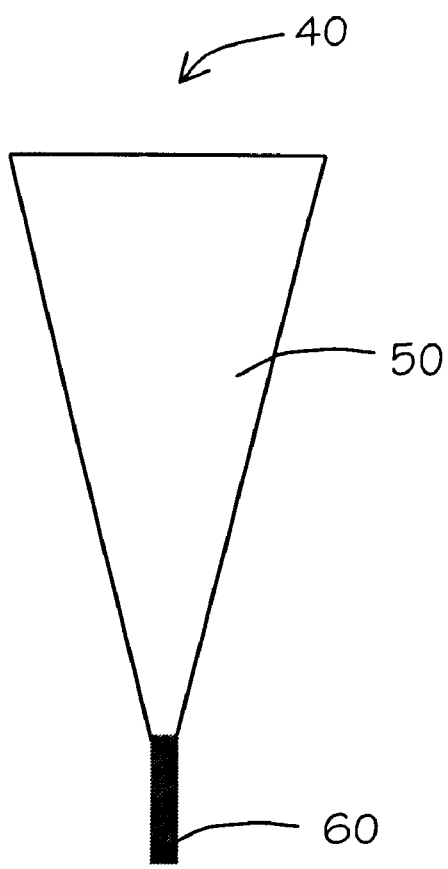
FIG. 2 depicts a nanoscale delivery device.

Any device known to those skilled in the art may serve as the nanoscale delivery device. FIG. 2 shows the device 40, in general, comprising a probe 50 having a microfluidic device 60 attached thereto. One type of probe used for the present invention is a proximal probe from an atomic force microscope. The microfluidic device forces or encourages the flow of the molecule to be applied to the surface of a substrate or another molecule. The probe may be chemically treated to induce transfer. Alternatively or in addition to the chemical treatment, a carbon nanotube may be incorporated into the probe tip. These nanotubes function similarly to that of a fountain pen, making it possible to transfer the difunctional molecule to the substrate or to direct placement of the difunctional molecule with respect to a previously reacted difunctional molecule. The use of the nanoscale delivery device allows the film produced to serve as an ultra small mask for further processing into such devices as semiconductors or electronic devices in a cost effective, well controlled manner.

Referring back to FIG. 1, when the second difunctional molecule is selectively applied on top of the first difunctional molecule, the second difunctional molecule is allowed to react with the unreacted Functional groups of the first difunctional molecule. This reaction may be enhanced by exposing the two molecules to a radiation source. The radiation source may be any radiation source known to those skilled in the art and preferably is selected from the group consisting of: visible light; ultraviolet light, and x-rays. Alternatively, the chemical reaction may be encouraged by exposing the two molecules to a rastered electron beam or a thermal energy source.

In an alternative process, the second difunctional molecule is not selectively applied on top of the first difunctional molecule. Rather, the second difunctional molecule is applied such that it covers the total surface of the first difunctional molecule and/or the substrate. One way to accomplish this is by dipping or spray coating the second difunctional molecule over the first difunctional molecule. When this technique is used, the first difunctional molecule is selectively reacted with the second difunctional molecule. One way this is accomplished is by exposing the molecules to an energy source that extends from a nanoscale delivery device. When the reaction is completed, the unreacted second difunctional molecules are removed by washing the substrate.

In yet another method, the patterned layer may be formed on the surface of the substrate by selectively applying the first difunctional molecule to the surface of the substrate using the nanoscale delivery device. This results in select areas of the substrate having functional groups that are capable of reacting with the second difunctional molecule. In those areas where no molecules have been applied to the substrate, the substrate will remain bare and the second difunctional molecules will be incapable of reacting. In this instance, the second difunctional molecule may be applied on top of the first difunctional molecule using any method known to those skilled in the art such as dipping or spray coating. Once the second difunctional molecule has been applied to the first difunctional molecule, the molecules are allowed to react. The reaction may be encouraged by exposing the molecules to an electromagnetic radiation source. Examples of such sources include but are not limited to: visible light; ultraviolet light; and x-rays. Other sources such as a rastered electron beam or a thermal energy source can also be used to encourage the reaction between the molecules. Moreover, the energy source may extend from a nanoscale delivery device as describe previously. Once the reaction is complete, the substrate is washed to remove the unreacted difluction molecules and leave a patterned layer.

Regardless of the method of the application of or reaction of the first and second difunctional molecules, the resulting product from the process is a patterned bilayer on the surface of the substrate.

Step 4 of FIG. 1 shows how the thickness of the pattern may be promoted. Once the patterned layer is formed a third difunctional molecule 70, having a functional group capable of reacting with an unreacted functional group of the second difunctional molecule, is applied to and reacted with the second difunctional molecule. The third difunctional molecule has functional groups (B) which are capable of reacting with the unreacted, exposed functional groups (A) from the second difunctional molecule 30 to form a layer.

Step 5 of FIG. 1 depicts how a fourth difunctional molecule 80 is applied to and reacted with the unreacted functional groups (C)of the third difunctional molecule. The fourth difunctional molecule 80 has functional groups (D) that are capable of reacting with the unreacted functional groups (C) of the third difunctional molecule 70.

Step 6 of FIG. 1 shows how multiple layers are built-up. Once the fourth difunctional molecule 80 is applied to and reacted with the unreacted functional groups in the third difunctional molecule 70. the third difunctional molecule 70 is applied to and reacted with the unreacted functional groups (E) of the fourth difunctional molecule 80. The fourth difunctional molecule 80 is then applied to and reacted with the unreacted functional groups (C) in the third difunctional molecule 70. As one can observe, multiple layers can be formed by repeating this process a plurality of times. The desired thickness of each bilayer is determined by the final application for the product. In this process, the resulting product is a substrate having multiple layers built on nanoscale features.

The above description and drawings are only illustrative of preferred embodiments which achieve the objects, features and advantages of the present invention, and it is not intended that the present invention be limited thereto. Any modification of the present invention which comes within the spirit and scope of the following claims is considered part of the present invention.

What is claimed is:

1. A process for producing nanoscale features on a substrate, the process comprising the steps of:
   a) providing a first difunctional molecule and a substrate having a surface wherein the first difunctional molecule has a functional group capable of reacting with the surface of the substrate;
   b) applying the first difunctional molecule to the surface of the substrate and allowing the functional group to react with the surface of the substrate;
   c) providing a second difunctional molecule wherein the second difunctional molecule has a functional group capable of reacting with an unreacted functional group of the first difunctional molecule;
   d) selectively applying the second difunctional molecule on top of the first difunctional molecule using a nanoscale delivery device; and
   e) allowing the second difunctional molecule to react with the unreacted functional group of the first difunctional molecule to form a patterned layer on the surface of the substrate.

2. A process according to claim 1, wherein the first difunctional molecule is applied to the substrate by dipping.

3. A process according to claim 1, wherein the first difunctional molecule and the second difunctional molecule are exposed to a radiation source, wherein the first difunctional molecule reacts with the second difunctional molecule.

4. A process according to claim 3, wherein the radiation source is selected from the group consisting of: visible light; ultraviolet light, and x-rays.

5. A process according to claim 1, wherein the first difunctional molecule and the second difunctional molecule are exposed to a rastered electron beam.

6. A process according to claim 1, wherein the first difunctional molecule and the second difunctional molecule are exposed to a thermal energy source.

7. A process according to claim 1, further comprising the step of applying and reacting a third difunctional molecule having a functional group capable of reacting with an unreacted functional group of the second difunctional molecule, to the second difunctional molecule to form a layer.

8. A process according to claim 7, further comprising the step of applying and reacting a fourth difunctional molecule having a functional group capable of reacting with an unreacted functional group of the third difunctional molecule, to the third difunctional molecule to form a layer.

9. A process according to claim 8, wherein the third difunctional molecule is applied to and reacted with the fourth difunctional molecule a plurality of times in alternating layers to form multiple layers.

10. A process according to claim 1, wherein the nanoscale delivery device comprises a probe having a microfluidic device attached thereto.

11. A nanoscale delivery device according to claim 10, wherein the probe is a tip of an atomic force microscope.

12. A nanoscale delivery device according to claim 10, wherein the probe further comprises a carbon nanotube.

13. A nanoscale delivery device according to claim 11, wherein the probe further comprises a carbon nanotube.

14. A process for producing nanoscale features on a substrate, the process comprising the steps of:
   a) providing a first difunctional molecule and a substrate having a surface wherein the first difunctional molecule has a functional group capable of reacting with the surface of the substrate;
   b) applying the first difunctional molecule to the surface of the substrate and allowing the functional group of the first difunctional molecule to react with the surface of the substrate;
   c) providing a second difunctional molecule wherein the second difunctional molecule has a functional group capable of reacting with an unreacted functional group of the first difunctional molecule;
   d) applying the second difunctional molecule on top of the first difunctional molecule;
   e) selectively reacting the first difunctional molecule with the second difunctional molecule; and
   f) washing the substrate to remove any unreacted second difunctional molecule and leaving a patterned layer on the surface of the substrate.

15. A process according to claim 14, wherein the first difunctional molecule and the second difunctional molecule are applied to the substrate by dipping.

16. A process according to claim 14, wherein the first difunctional molecule is selectively reacted with the second difunctional molecule by exposing the first difunctional molecule and the second difunctional molecule to an energy source extending from a nanoscale delivery device.

17. A process according to claim 16, wherein the nanoscale delivery device comprises a probe having a microfluidic device attached thereto.

18. A nanoscale delivery device according to claim 17, wherein the probe is a tip of an atomic force microscope.

19. A nanoscale delivery device according to claim 17, wherein the probe further comprises a carbon nanotube.

20. A nanoscale delivery device according to claim 18, wherein the probe further comprises a carbon nanotube.

21. A process according to claim 14, further comprising the step of applying and reacting a third difunctional molecule having a functional group capable of reacting with an unreacted functional group of the second difunctional molecule, to the second difunctional molecule to form a second layer.

22. A process according to claim 21, further comprising the step of applying and reacting a fourth difunctional molecule having a functional group capable of reacting with an unreacted functional group of the third difunctional molecule, to the third difunctional molecule to form a layer.

23. A process according to claim 22, wherein the third difunctional molecule is applied to and reacted with an unreacted functional group of the fourth difunctional molecule in alternating layers a plurality of times to form multiple layers.

24. A process for producing nanoscale features on a substrate, the process comprising the steps of:
   a) providing a first difunctional molecule and a substrate having a surface wherein first difunctional molecule has a functional group capable of reacting with the surface of the substrate;
   b) applying the first difunctional molecule to the surface of the substrate using a nanoscale delivery device and allowing the functional group of the first difunctional molecule to react with the surface of the substrate;

c) providing a second difunctional molecule wherein the second difunctional molecule has a functional group capable of reacting with an unreacted functional group of the first difunctional molecule;

d) applying the second difunctional molecule on top of the first difunctional molecule;

e) allowing the first difunctional molecule and the second difunctional molecule to react to form a patterned layer; and f) washing the substrate to remove the unreacted second difunctional molecule.

25. A process according to claim 24, wherein the nanoscale delivery device comprises a probe having a microfluidic device attached thereto.

26. A nanoscale delivery device according to claim 25, wherein the probe is a tip of an atomic force microscope.

27. A nanoscale delivery device according to claim 25, wherein the probe further comprises a carbon nanotube.

28. A nanoscale delivery device according to claim 26, wherein the probe further comprises a carbon nanotube.

29. A process according to claim 24, wherein the second difunctional molecule is applied on top of the first difunctional molecule by dipping.

30. A process according to claim 24, wherein the first difunctional molecule and the second difunctional molecule are exposed to an electromagnetic radiation source.

31. A process according to claim 30, wherein the electromagnetic radiation source is selected from the group consisting of: visible light, ultraviolet light, and x-rays.

32. A process according to claim 24, wherein the first difunctional molecule and the second difunctional molecule are exposed to a rastered electron beam.

33. A process according to claim 24, wherein the first difunctional molecule and the second difunctional molecule are exposed to a thermal energy source.

34. A process according to claim 24, further comprising the step of applying and reacting a third difunctional molecule having a functional group capable of reacting with an unreacted functional group of the second difunctional molecule, to the second difunctional molecule to form a layer.

35. A process according to claim 34, further comprising the step of applying and reacting a fourth difunctional molecule having a functional group capable of reacting with an unreacted functional group of the third difunctional molecule, to the third difunctional molecule to form a layer.

36. A process according to claim 35, wherein the third difunctional molecule is applied to and reacted with an unreacted functional group of the fourth difunctional molecule in alternating layers a plurality of times to form multiple layers.

37. A substrate having nanoscale features prepared by the process according to claim 1.

38. A substrate having multiple layers built on nanoscale features prepared by the process according to 9.

39. A substrate having nanoscale features prepared by the process according to claim 14.

40. A substrate having multiple layers built on nanoscale features prepared by the process according to 23.

41. A substrate having nanoscale features prepared by the process according to claim 24.

42. A substrate having multiple layers built on nanoscale features prepared by the process according to claim 36.

* * * * *